United States Patent [19]
Jenq et al.

[11] Patent Number: 6,051,507
[45] Date of Patent: Apr. 18, 2000

[54] METHOD OF FABRICATING CAPACITOR WITH HIGH CAPACITANCE

[75] Inventors: J. S. Jason Jenq, Pingtung; Der-Yuan Wu, Hsinchu, both of Taiwan

[73] Assignee: United Microelectronics Corp., Hsinchu, Taiwan

[21] Appl. No.: 09/172,406

[22] Filed: Oct. 14, 1998

[30] Foreign Application Priority Data

Aug. 4, 1998 [TW] Taiwan .................................. 87112805

[51] Int. Cl.$^7$ ...................................................... H01L 21/00
[52] U.S. Cl. ............................ 438/719; 438/738; 438/756
[58] Field of Search .................................... 438/691, 706, 438/710, 719, 723, 725, 738, 743, 756; 216/38.51, 67, 79, 88, 99

[56] References Cited

U.S. PATENT DOCUMENTS 5,464,791 11/1995 Hirota .................................. 438/754 X
5,928,969 7/1999 Li et al. .................................. 438/753

*Primary Examiner*—William Powell
*Attorney, Agent, or Firm*—Thomas, Kayden, Horstemeyer & Risley

[57] ABSTRACT

The invention provides a method of fabricating a capacitor with high capacitance. A substrate having word lines and bit lines is provided, and a dielectric layer is formed to cover the substrate. A contact window is formed in the dielectric layer to expose an active region. A conductive layer is formed to fill the contact window to connect with the active region. An insulating layer is formed on the conductive layer and the insulating layer and the conductive layer are defined. A hemispherical grained-Si (HSG-Si) layer is then formed on the substrate. An etching process is performed on the HSG-Si layer to expose the dielectric layer using a portion of the insulating layer as a mask. The insulating layer is removed. A storage node with a gear toothed profile is then formed.

10 Claims, 3 Drawing Sheets

METHOD OF FABRICATING CAPACITOR WITH HIGH CAPACITANCE

CROSS-REFERENCE TO RELATED APPLICATION

This application claims the priority benefit of Taiwan application Ser. No. 87112805, filed Aug. 4, 1998, the full disclosure of which is incorporated herein by reference.

BACKGROUND OF THE INVENTION

1. Field of Invention

The present invention relates to a method of fabricating a capacitor with high capacitance. More particularly, the present invention relates to a method of fabricating a capacitor with high capacitance by forming storage nodes with a gear toothed profile.

2. Description of Related Art

A dynamic random access (DRAM) is an integrated circuit (IC) device that has been used broadly in every kind of field, and especially in the electronics industry. With the steady improvement in IC fabrication, a DRAM with higher capacitance is in great demand. People in the industry are devoted to the study of how to fabricate a capacitor with high capacitance while dimensions of devices are reduced.

A stacked capacitor (STC) structure, one kind of a DRAM capacitor structure, is used to satisfy the requirement of reducing dimensions of IC devices. But some difficulties gradually appear while increasing capacitance of a STC. A DRAM memory usually includes a STC structure and a transfer gate transistor above the STC structure. The STC is connected with the source of the transfer gate transistor. However, the dimension of the STC structure is restricted by the gradually reduced dimension of the transfer gate transistor. The STC includes two electrodes separated by a dielectric layer. The thickness of the dielectric layer is necessarily reduced or the area of the capacitor is increased in order to increase the capacitance of the STC structure. However, the amount by which the thickness of the dielectric layer can be reduced is limited by considerations of device reliability.

SUMMARY OF THE INVENTION

Accordingly, the present invention provides a method of fabricating a STC capacitor with high capacitance. A storage node with a gear toothed profile is formed, and a hemispherical grained-Si layer is further formed on the gear toothed node in order to increase surface areas of storage electrodes. Therefore, the capacitance is increased.

To achieve these and other advantages and in accordance with the purpose of the invention, as embodied and broadly described herein, the invention provides a method of fabricating a capacitor with high capacitance. A substrate having a word line and a bit line is provided. A dielectric layer is formed to cover the substrate. A contact window is formed in the dielectric layer to expose an active region. A conductive layer is formed to fill the contact window and connect to the active region. An insulating layer is formed on the conductive layer to define the insulating layer and the conductive layer. A hemispherical grained-Si (HSG-Si) layer is then formed on the substrate. An etching process is performed on the HSG-Si layer to expose the dielectric layer using a portion of the insulating layer as a mask. The insulating layer is removed. A storage node with a gear toothed profile is then formed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
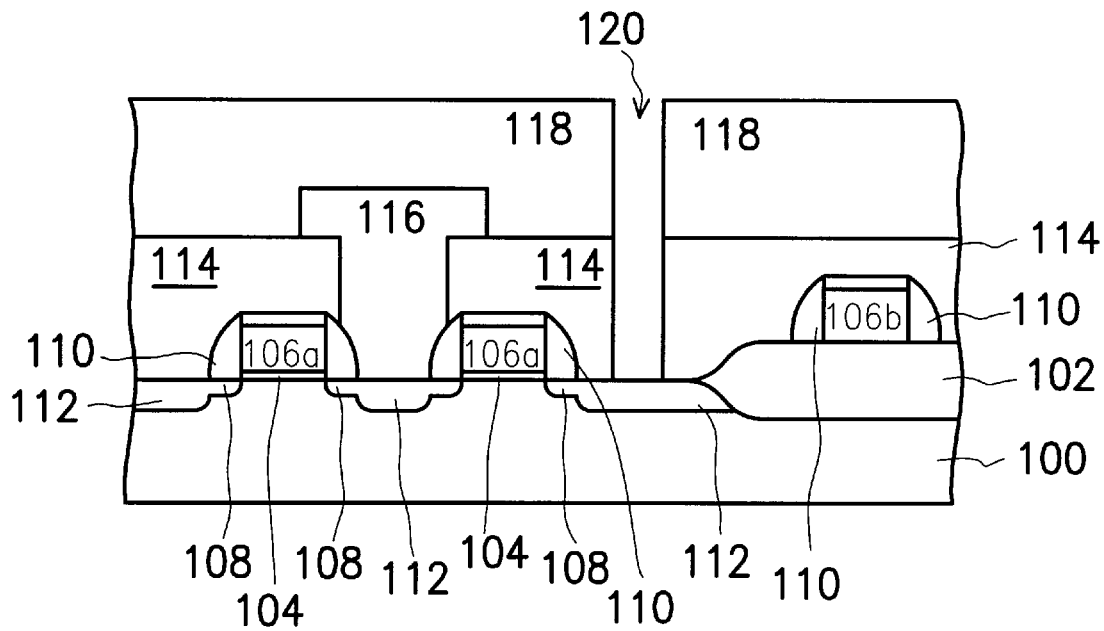
FIGS. 1A through 1F are cross-sectional views showing a method of fabricating a capacitor with high capacitance according to the preferred embodiment of this invention.

Reference will now be made in detail to the present preferred embodiments of the invention, examples of which are illustrated in the accompanying drawings. Wherever possible, the same reference numbers are used in the drawings and the description to refer to the same or like parts.

FIGS. 1A through 1F are cross-sectional views showing a method of fabricating a capacitor with high capacitance according to the preferred embodiment of this invention. A storage node with a gear toothed profile is formed, and a hemispherical grained-Si layer is further formed on the gear toothed node in order to increase surface areas of storage electrodes. Thus, the capacitance of the capacitor is increased.

Referring to FIG. 1A, a DRAM is fabricated on a semiconductor substrate 100 having orientation <100>. The fabrication of DRAM includes forming a field effect transistor, a word line and a bit line by conventional methods.

A method of forming a word line and a bit line is expressed as followed. At first, a field oxide layer 102 defined by a silicon nitride layer is formed in a substrate 100. Thermal oxidation is used to form the field oxide layer 102 with a thickness of about 4000–6000 Å in an atmosphere of oxygen. A gate oxide layer 104 with a thickness of about 100 Å is formed on the substrate 100 by thermal oxidation in an atmosphere of oxygen. The operating temperature ranges from about 850° C. to about 1000° C. Chemical vapor deposition (CVD) can also be used to form the gate oxide layer 104.

A doped polysilicon layer with a thickness of about 1000 Å is formed on the substrate 100 to serve as a gate structure of the field effect transistor. The doped concentration of phosphorus ions ranges from about $10^{20}$ to $10^{21}$ ions/cm$^2$. A tungsten silicide layer with a thickness of about 1000 Å is then formed on the polysilicon layer to increase conductivity of the gate. A photolithography etching process is performed to define the polysilicon layer and the tungsten silicide layer to form a gate 106a and a word line 106b. An ion implantation step is performed in the substrate 100 to form an active region 108 by a conventional method. Spacers 110 are further formed on the sidewalls of the gate 106a and the word line 106b. Then, an ion implantation step is performed in the substrate 100 to form an active region 112. The active regions 108 and 112 are formed as a lightly doped drain (LDD).

As shown as FIG. 1A, a dielectric layer 114 with a thickness of about 2000 Å is formed on the substrate 100 to cover the gate 106a and the word line 106. The dielectric layer 114 can be formed by, for example, deposition of first an oxide layer with a thickness of about 2000 Å by atmospheric CVD and then a BPSG layer with a thickness of 7500 Å by low pressure chemical vapor deposition (LPCVD). The dielectric layer 114 is defined to form a contact window between the gates 106a. Then, a polysilicon layer 116 is formed to fill the contact window. The polysilicon layer 116 connects with the active region 112 and a portion of the polysilicon layer lies on the dielectric layer 114 to serve as a bit line.

A dielectric layer 118 is then formed over the substrate 100. The method of forming the dielectric layer 118 includes forming an undoped oxide layer with a thickness of about 1000–2000 Å and a BPSG layer with a thickness of about 7500 Å. A planarization process is performed on the oxide layer and the BPSG layer in order to improve topography. The dielectric layer 118 and the dielectric layer 114 are defined by a conventional photography etching process in order to form a contact window 120 having the smallest width necessary to expose the active region 112.

Figure 1B:
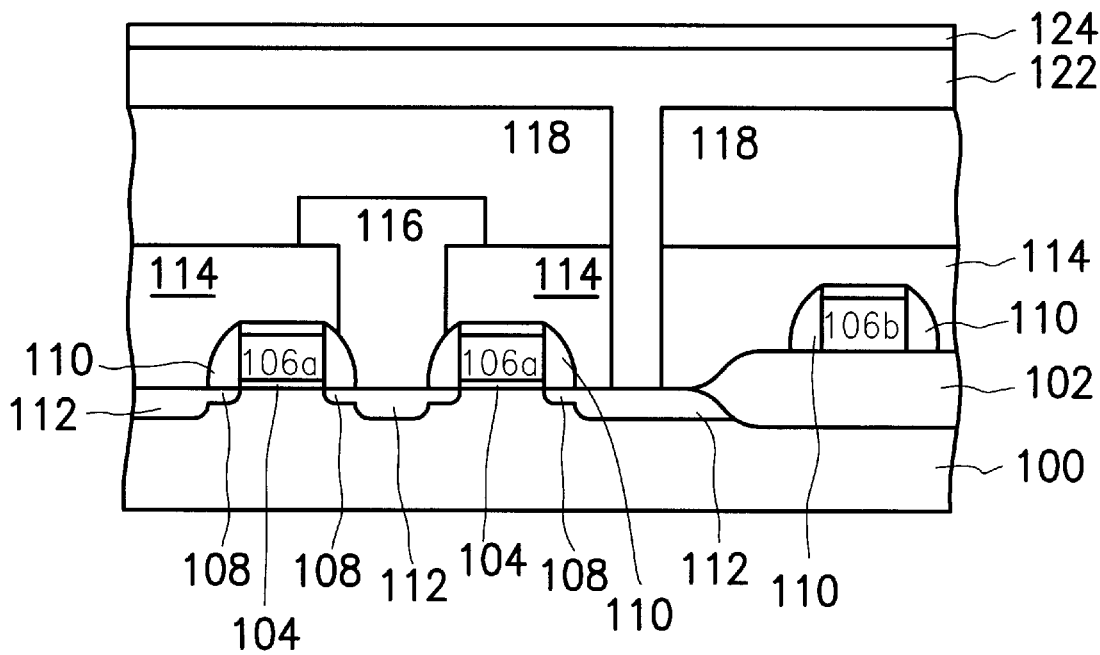

Referring to FIG. 1B, a conductive layer 122 is formed on the dielectric layer 118 by deposition. For example, a doped polysilicon layer with a thickness of about 6000–10000 Å is formed by LPCVD to fill the contact window. The doped concentration of phosphorus ions ranges from about $10^{20}$ to $10^{21}$ ions/cm$^2$ and is used to increase the conductivity of the polysilicon layer. An insulating layer 124 is formed upon the conductive layer 122. The method of forming the insulating layer 124 includes forming an oxide layer with a thickness of about 500–1000 Å by plasma enhanced CVD (PECVD).

Figure 1C:
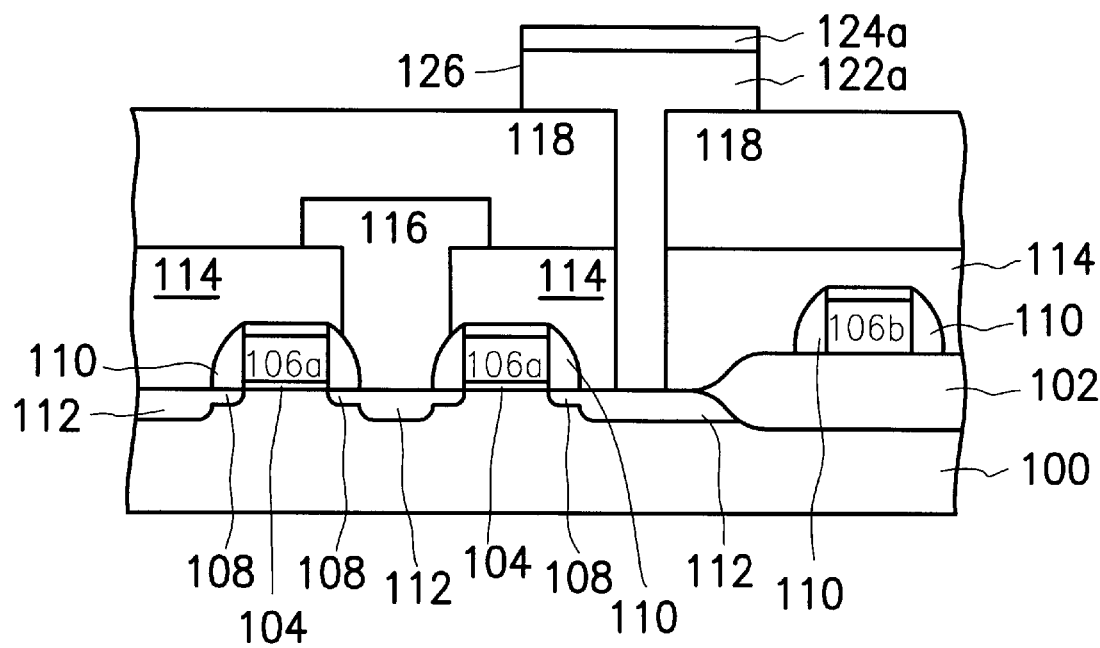
Figure 1D:
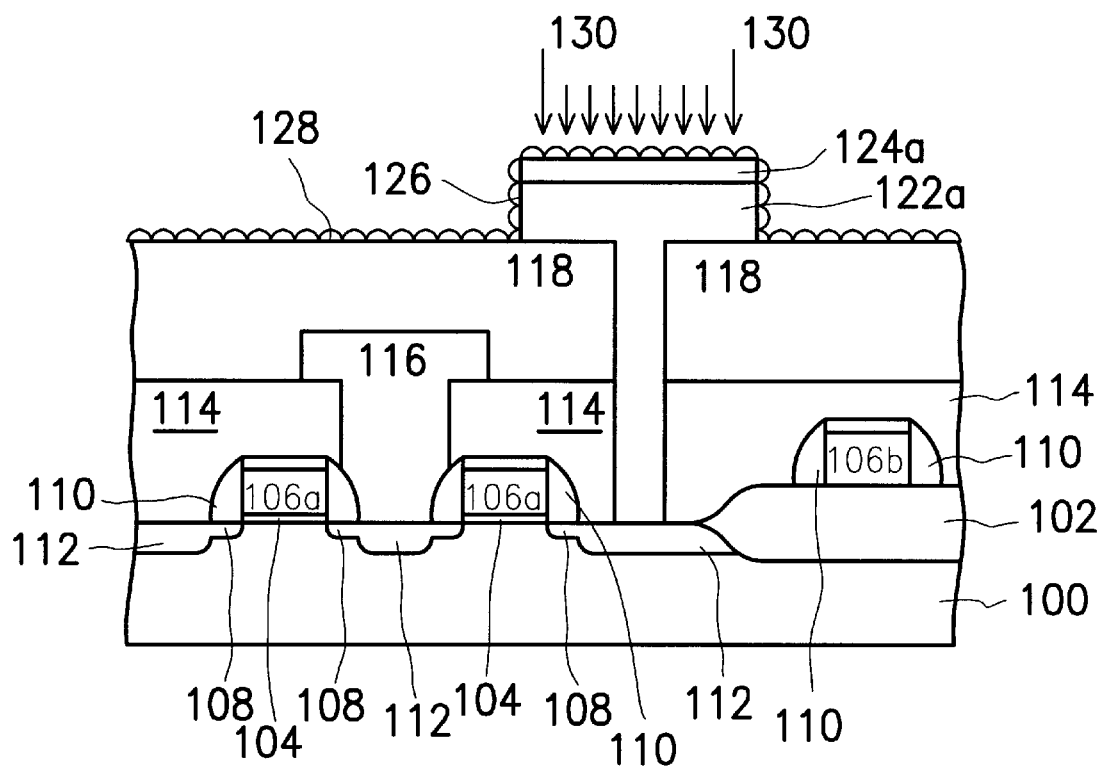

As shown as FIG. 1C, a portion of the insulating layer 124a and the conductive layer 122a are removed by a photolithography etching process to expose a portion of the dielectric layer 118 and the sidewall area 126 which includes the sidewalls of the conductive layer 122a and insulating layer 124a. As shown in FIG. 1D, a hemispherical grained-Si (HSG) layer 128 is formed over the substrate 100 to cover the exposed dielectric layer 118, the sidewall structure 126 and the top surface of insulating layer 124a.

Figure 1E:
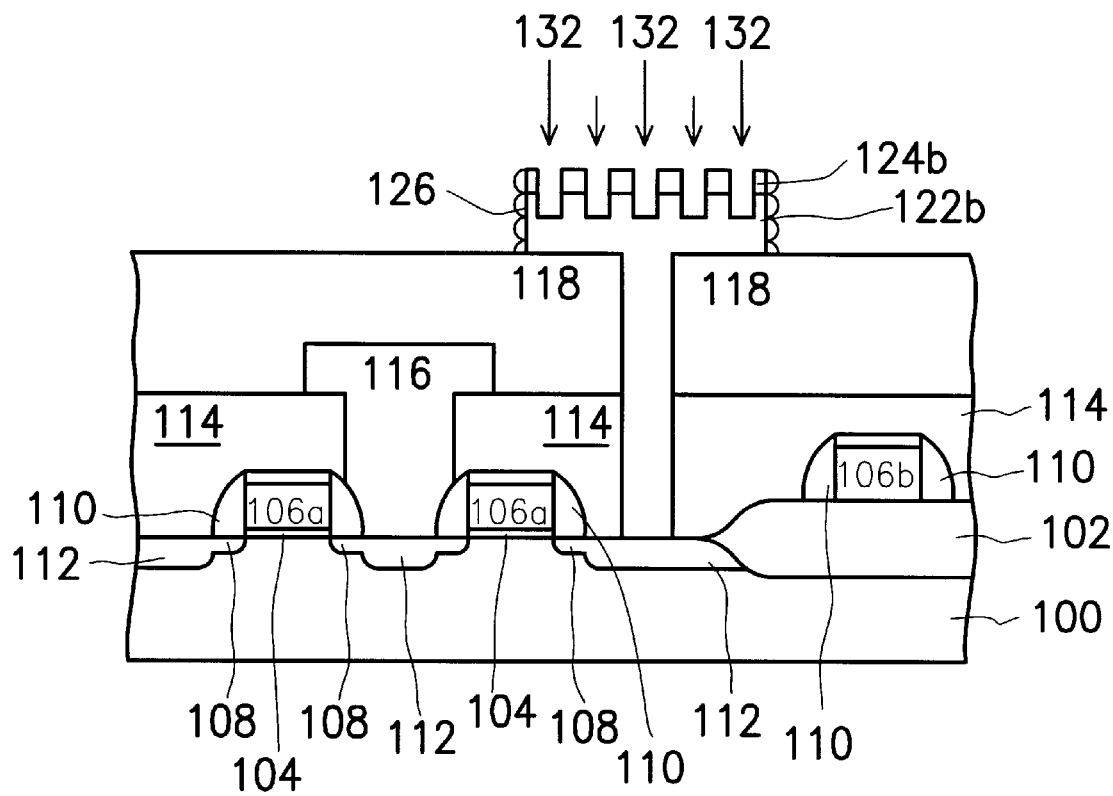

An overetching process, such as a dry etching process, is performed on the HSG-Si layer 128. Because the overetching process is an anisotropic process, the portion of HSG-Si layer 128 on the dielectric layer 118 is be removed and the portion of HSG-Si layer 128 of the sidewall structure 126 remains. Besides, the insulating layer 118 and the HSG-Si layer 128 on the insulating layer 118 are used as a mask while performing the overetching process. Gaps 130 of the HSG-Si layer 128 are first etched and a portion of the insulating layer 124a is then removed. The etching process is stopped by the insulating layer 124b below the HSG-Si layer 128, which functions as a mask. Then, trenches 132 are formed in the conductive layer 122a, as shown in FIG. 1E. Therefore, material of the insulating layer 124a must be different from the HSG-Si layer 128 and the conductive layer 122a in order for the insulating layer 124a to be used as the mask for the conductive layer 122a.

Figure 1F:
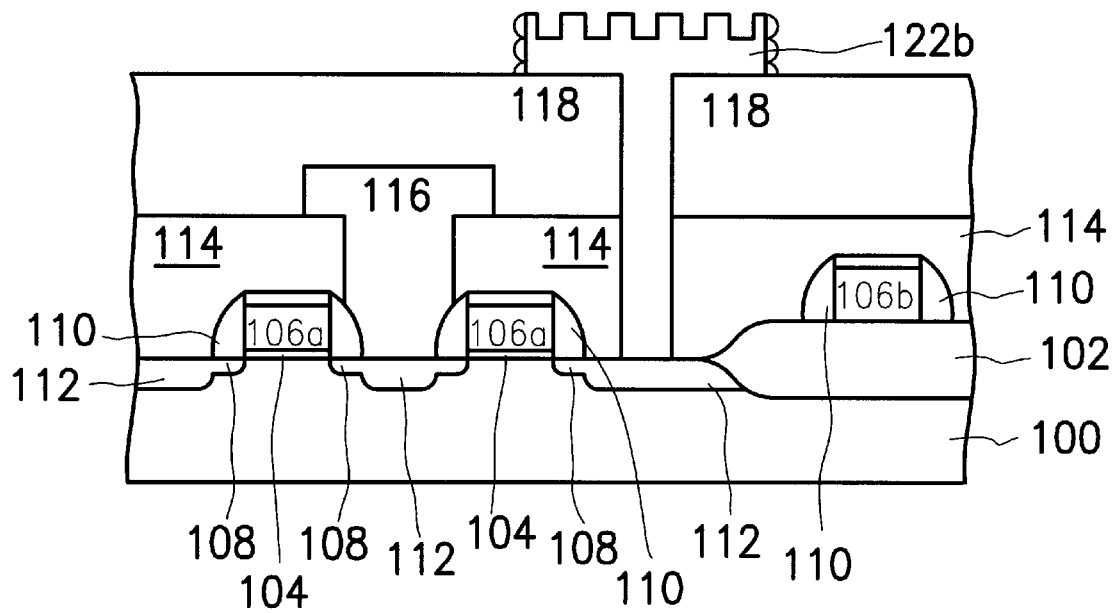

Referring to FIG. 1F, the insulating layer 124b is removed by a method using an etchant such as hydrofluoric acid (HF) solution with a concentration of about 100:1 or a BOD solution with a concentration of about 20:1 to remove the insulating layer 124b and expose the conductive layer 122b. In this manner, a storage node with a gear toothed profile is formed. A thin dielectric layer, such as an ONO layer (not shown), is formed on the storage node. A conductive layer (not shown) is formed on the dielectric layer in order to be a relative node of the capacitor. Thus, the capacitor is formed.

By forming an insulating layer and a HSG-Si layer on the conductive layer and overetching them in the invention, a storage node with a gear toothed profile is formed on the conductive layer. The HSG-Si layer also lies on the sidewalls of the conductive layer, therefore, the greater surface area provided by the HSG-Si layer and the conductive layer with a gear toothed profile can be used to increase capacitance on the limited areas of the substrate.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a capacitor with high capacitance, comprising:

forming a dielectric layer having a contact window to expose an active region in a semiconductor substrate;

forming a conductive layer on the dielectric layer to fill the contact window;

forming an insulating layer on the conductive layer;

patterning the insulating layer and the conductive layer, so that a portion of the dielectric layer is exposed;

forming a hemispherical grained-Si (HSG-Si) layer over the substrate to cover the insulating layer, exposed sidewalls of the conductive layer and the exposed portion of the dielectric layer, wherein the HSF-Si layer comprises a plurality of gaps form between hemispherical silicon grains;

performing an anisotropic overetching process to remove the HSG-Si layer, wherein a portion of the HSG-Si layer on the sidewalls of the conductive layer remains, and a plurality of trenches are formed in a top portion of the conductive layer since the insulating layer is first etched from the gaps of the HSG-Si layer and then the insulating layer functions as a trench mask on the conductive layer for forming the plurality of trenches; and removing the insulating layer to expose the conductive layer to form a storage node of the capacitor.

2. A method according to claim 1, wherein the conductive layer comprises a polysilicon layer.

3. A method according to claim 1, wherein the insulating layer comprises an oxide layer.

4. A method according to claim 3, wherein the insulating layer is formed by plasma enhanced chemical vapor deposition.

5. A method according to claim 1, wherein the insulating layer is from about 500 Å to 1000 Å thick.

6. A method according to claim 1, wherein the dielectric layer comprises an oxide layer.

7. A method according to claim 1, wherein the step of removing the insulating layer is by a wet etching process.

8. A method according to claim 1, wherein the step of etching the HSG-Si layer is by a dry etching process.

9. A method according to claim 1, wherein a portion of the insulating layer is used as a mask for the conductive layer in the step of etching the HSG-Si layer.

10. A method according to claim 1, wherein the substrate in semiconductor further comprises a word line and a bit line.

* * * * *